(12) United States Patent
Kovac et al.

(10) Patent No.: US 12,519,469 B2
(45) Date of Patent: *Jan. 6, 2026

(54) SWITCH CAPACITANCE CANCELLATION CIRCUIT

(71) Applicant: Murata Manufacturing Co., Ltd., Nagaokakyo (JP)

(72) Inventors: David Kovac, Arlington Heights, IL (US); Joseph Golat, Crystal Lake, IL (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/674,281

(22) Filed: May 24, 2024

(65) Prior Publication Data

US 2024/0313772 A1     Sep. 19, 2024

Related U.S. Application Data

(63) Continuation of application No. 17/351,128, filed on Jun. 17, 2021, now Pat. No. 12,028,060.

(51) Int. Cl.
*H03K 17/687* (2006.01)
*H01L 23/66* (2006.01)
*H03K 19/003* (2006.01)

(52) U.S. Cl.
CPC ......... *H03K 17/6872* (2013.01); *H01L 23/66* (2013.01); *H03K 19/00384* (2013.01); *H01L 2223/6605* (2013.01); *H01L 2223/6672* (2013.01)

(58) Field of Classification Search
CPC ......... H03K 17/6872; H03K 19/00384; H03K 17/693; H03K 17/145; H01L 23/66; H01L 2223/6605; H01L 2223/6672
See application file for complete search history.

(56) References Cited

U.S. PATENT DOCUMENTS

| | | | |
|---|---|---|---|
| 12,028,060 B2 * | 7/2024 | Kovac | H01L 23/66 |
| 2009/0146498 A1 * | 6/2009 | Kanno | H02M 5/08 |
| | | | 307/72 |
| 2011/0316062 A1 * | 12/2011 | Kondo | H04B 1/48 |
| | | | 257/E29.345 |
| 2014/0266415 A1 | 9/2014 | Kerr et al. | |
| 2015/0022024 A1 | 1/2015 | Dicicco et al. | |

(Continued)

FOREIGN PATENT DOCUMENTS

| | | |
|---|---|---|
| CN | 117480728 A | 1/2024 |
| WO | 2022/265842 A1 | 12/2022 |

OTHER PUBLICATIONS

A 31.3-dBm Bulk CMOS T/R Switch Using Stacked Transistors With Sub-Design-Rule Channel Length in Floated p-Wells (Year: 2007).*

(Continued)

*Primary Examiner* — Metasebia T Retebo
(74) *Attorney, Agent, or Firm* — Steinfl + Bruno LLP (57) ABSTRACT

Methods and devices used to cancel non-linear capacitances in high power radio frequency (RF) switches manufactured in bulk complementary metal-oxide-semiconductor (CMOS) processes are disclosed. The methods and devices are also applicable to stacked switches and RF switches fabricated in silicon-on-insulator (SOI) technology.

18 Claims, 9 Drawing Sheets

(56) References Cited

U.S. PATENT DOCUMENTS

2022/0407512 A1    12/2022    Kovac et al.

OTHER PUBLICATIONS

Final Office Action for U.S. Appl. No. 17/351,128 filed on Jun. 17, 2021 on behalf of PSEMI Corporation Mail Date: Oct. 24, 2023 14 pages.
International Report for International Preliminary Report on Patentability for Application No. PCT/US2022/031417 filed on May 27, 2022 on behalf of PSEMI Corporation Mail Date: Dec. 14, 2023, 7 pages.
International Search Report and Written Opinion for International Application No. PCT/US2022/031417 filed on May 27, 2022 on behalf of PSEMI Corporation Mail Date: Aug. 23, 2022 9 pages.
Non-Final Office Action for U.S. Appl. No. 17/351,128 filed on Jun. 17, 2021 on behalf of PSEMI Corporation Mail Date: Apr. 12, 202314 pages.
Notice of Allowance for U.S. Appl. No. 17/351,128 filed on Jun. 17, 2021 on behalf of PSEMI Corporation Mail Date: Feb. 28, 2024 7 pages.

\* cited by examiner

SWITCH CAPACITANCE CANCELLATION CIRCUIT

CROSS-REFERENCE TO RELATED APPLICATIONS

The present application is a continuation of U.S. patent application Ser. No. 17/351,128, filed on Jun. 17, 2021, for "SWITCH CAPACITANCE CANCELLATION CIRCUIT", the content of which is incorporated herein by reference in its entirety.

TECHNICAL FIELD

The present disclosure is related to switch capacitance cancellation, more in particular to methods and devices used to cancel non-linear capacitances in high power radio frequency (RF) switches.

BACKGROUND

High power switches are generally used in radio-frequency integrated circuit (RFIC) design. It is known in the art that silicon-on-insulator (SOI) CMOS is well suited for RF switch design due to low ON resistance and low parasitic capacitances. SOI switches are also extremely linear due in part to minimal diode capacitances, in addition to accumulated charge removal techniques. It is desirable to create high performance switches in bulk CMOS due to the cost advantages and better scalability of the process, however the larger parasitic capacitances present a design challenge. Bulk CMOS switches in particular have undesired non-linear capacitances due to the diodes from source/drain to body.

Figure 1A:
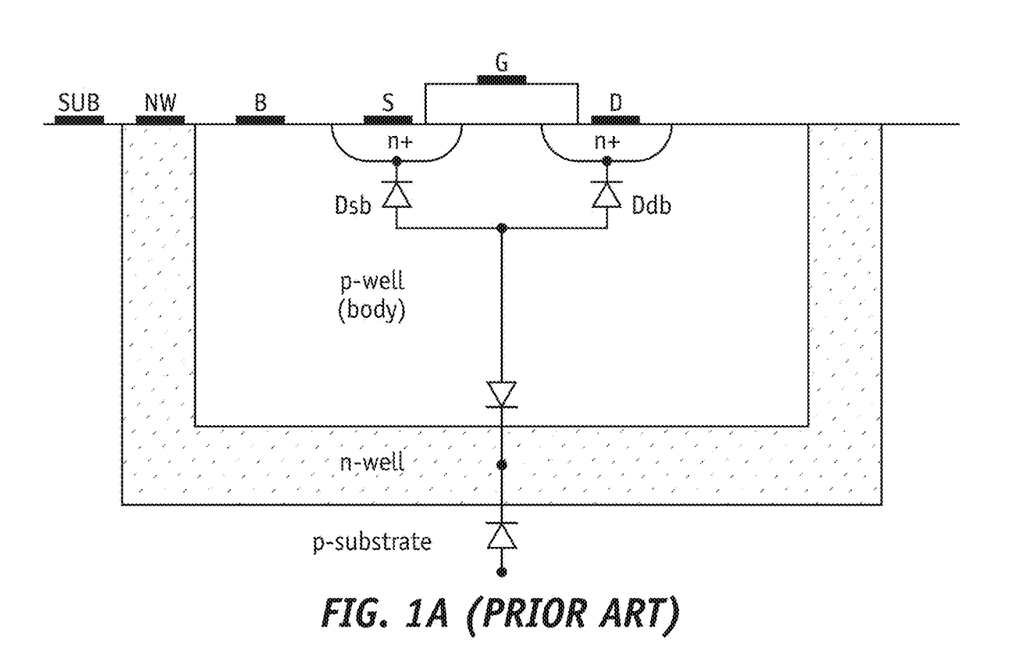
FIG. 1A shows a prior art N-channel field effect transistor (NFET) device built with triple-well bulk CMOS process.
Figure 1B:
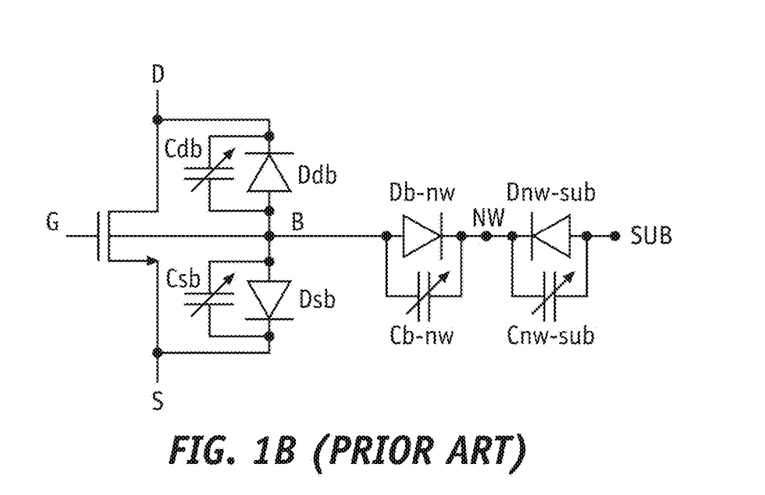
FIG. 1B shows the electrical model of the NFET shown in FIG. 1A.

FIG. 1A shows a cross section of a prior art N-channel field effect transistor (NFET) device built with triple-well bulk CMOS process. FIG. 1B shows the electrical model of the NFET shown in FIG. 1A. As shown in FIGS. 1A-1B, the drain-body and source-body junctions are represented through respective drain-body and source-body diodes (Ddb, Dsb) with corresponding non-linear capacitance (Cdb, Csb). Such non-linear capacitances degrade linearity when the NFET device is modulated with an RF signal. Also shown in FIGS. 1A-1B are body-N-well and N-well-substrate diodes (Db-nw, Dnw-sub) with respective non-linear capacitances (Cb-nw, Cnw-sub) further degrading the non-linear performance (e.g. harmonics) of the NFET device.

Figure 1C:
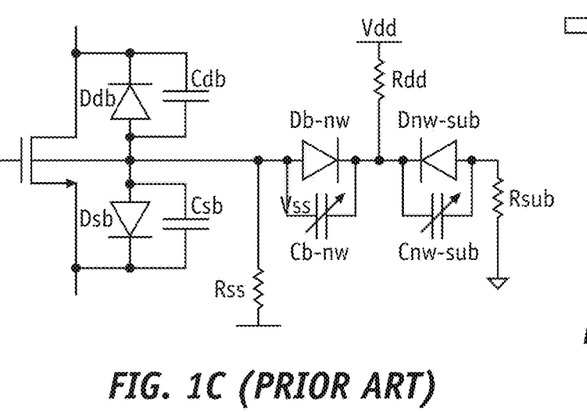
FIGS. 1C-1D show prior art bulk-CMOS switches with well biasing (1C) and equivalent RF circuit (1D).
Figure 1D:
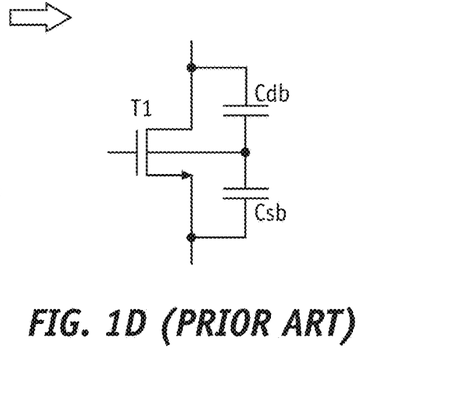

In high power switches manufactured in a bulk-CMOS process, the body, N-well and substrate may be RF floated for improved insertion loss, so the body-N-well and N-well-sub capacitances are substantially reduced or eliminated. This is shown in FIG. 1C where the body is coupled to bias voltage (Vss) via resistor (Rss), the N-well is coupled to bias voltage (Vdd) through resistor (Rdd) and the substrate is grounded through resistor (Rsub), although the substrate could alternatively be coupled to a bias voltage instead of ground. The resistors shown in FIG. 1C may also be replaced by RF chokes. As mentioned previously and shown in FIG. 1D, as a result of RF floating, the body-N-well and N-well-sub capacitances are practically suppressed, however, the drain-body and source-body capacitances still remain causing design challenges when implementing high power RF switches in bulk-CMOS process.

Figure 1E:
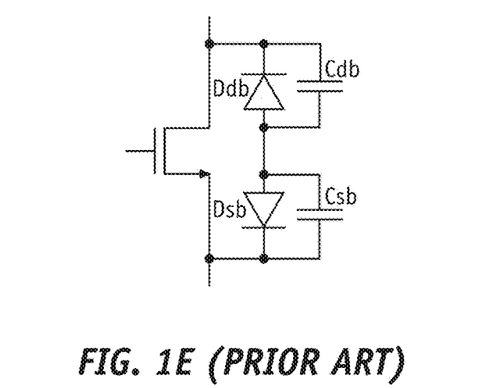
FIG. 1E shows a prior art electrical model of an SOI switch.

FIG. 1E shows the electrical model of an NFET device when implemented in SOI process and where the body is grounded for an improved performance. Compared with the bulk-CMOS process, high power switches built in SOI technology provide a better overall linearity. However, as shown in FIG. 1E, drain-body and source-body capacitances, although smaller than their counterparts in the bulk-CMOS process, are still present and reduction of such capacitances for improved linearity is desired.

In view of the above, there is a need for methods and devices to reduce or minimize the non-linear drain-body and source-body capacitances of high-power switches, more in particular when manufactured using bulk CMOS and SOI processes.

SUMMARY

The disclosed methods and devices address the above-mentioned need and provide solutions to the described problems.

According to a first aspect of the present disclosure, a method for controlling a capacitance of an N-channel field effect transistor (NFET) when in OFF state over a voltage range is disclosed, the method comprising: comparing a nonlinear NFET drain-source capacitance-voltage (C/V) response of the NFET with a voltage variable capacitor C/V response of a set of voltage variable capacitors; from the set of voltage variable capacitors, selecting a voltage variable capacitor such that a combination of the selected voltage variable capacitors C/V response with the NFET drain-source C/V response results in a combination C/V response including a substantially constant capacitance region along a voltage range, and coupling the selected voltage variable capacitor across drain and source terminals of the NFET by connecting a first terminal of the selected voltage variable capacitor to a drain terminal of the NFET and a second terminal of the selected voltage variable capacitor to a source terminal of the NFET.

According to a second aspect of the present disclosure, a switching arrangement is provided, comprising: a switching N-channel field effect transistor (NFET), the switching NFET having a nonlinear NFET drain-source capacitance-voltage (C/V) response; and a voltage variable capacitor with a first terminal connected to a drain terminal of the switching NFET and a second terminal connected to a source terminal of the switching NFET, the voltage variable capacitor having a voltage variable capacitor C/V response, wherein a combination C/V response of the switching NFET and the voltage variable capacitor includes a substantially constant capacitance region across a selected voltage range.

According to a third aspect of the present disclosure, a switching arrangement is provided, comprising: a plurality switching N-channel field effect transistors (NFETs) arranged in a stacked configuration, each switching NFET having a nonlinear NFET drain-source capacitance-voltage (C/V) response; a voltage variable capacitor with a first terminal connected to a drain terminal of a first switching NFET of the plurality of switching NFETs, and a second terminal connected to a source terminal of a second switching NFET of the plurality of switching NFETs, the voltage variable capacitor having a voltage variable capacitor C/V response, wherein a combination of a C/V response existing across the drain terminal of the first switching NFET and the source terminal of the second NFET, with the voltage variable capacitor C/V response includes a substantially constant capacitance region across a selected voltage range.

The details of one or more embodiments of the invention are set forth in the accompanying drawings and the descrip-

DESCRIPTION OF THE DRAWINGS

Like reference numbers and designations in the various drawings indicate like elements.

DETAILED DESCRIPTION

Figure 2:
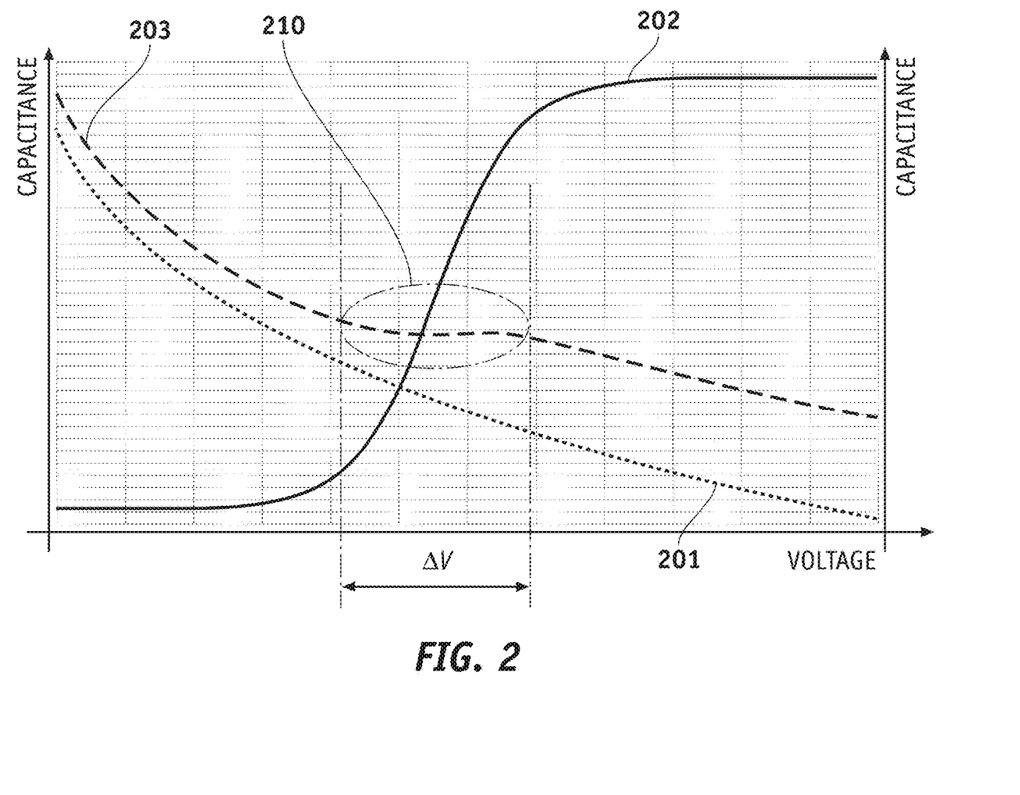
FIG. 2 shows capacitance-voltage (C/V) responses of a switch, a varactor, and the combination of such responses.

Generally, an NFET device in OFF state has a non-linear C/V (capacitance vs. drain-source voltage) response. Curve (201) of FIG. 2 is a typical example of such response where the NFET capacitance is a decreasing function of drain-source voltage of the NFET. In order to achieve a higher linearity, a flat C/V response (i.e. a response having a substantially constant capacitance value along a voltage range) is highly desired. According to the teachings of the present disclosure, combining an electronic element having a C/V response being the opposite of the NFET device C/V response, will result in a flat response, at least over a certain voltage range.

Figure 3A:
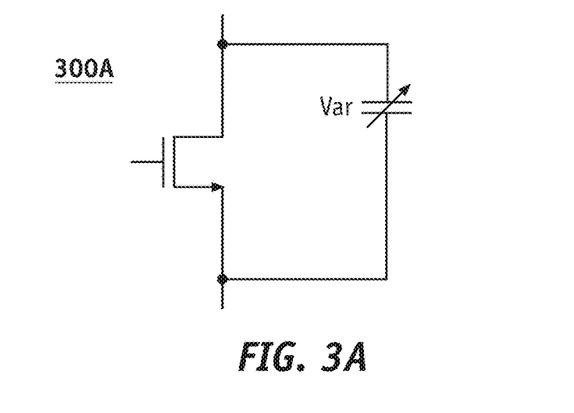
FIGS. 3A-3D show exemplary switching arrangements according to an embodiment of the present disclosure.

In order to clarify the concept disclosed above, reference is made to FIG. 3A showing an exemplary circuit arrangement (300A) according to embodiment of the present disclosure. Circuit arrangement (300A) comprises a voltage variable capacitor (VVC) implemented in parallel to an NFET device, e.g. across drain and source terminals of the NFET device, so that a first terminal of the VVC is connected to a source terminal of the NFET and a second terminal of the VVC is connected to a drain terminal of the NFET. The voltage variable capacitor in this embodiment is a varactor (Var). As one with skill in the art may appreciate, curve (202) of FIG. 2 represents the C/V response of varactor (Var) of FIG. 3A, while curve (203) of FIG. 2 is the result of combining curves (201, 202). The two vertical Y-axes shown in FIG. 2 represent different scales. The Y-axis on the right has a zoomed-in scale of the Y-axis on the left. Curves (201, 203) correspond to the Y-axis on the left and curve (202) corresponds to the Y-axis on the right. As can be seen, the resulting response shown as curve (203) comprises a substantially flattened or constant region (210) over a certain voltage range ΔV extending from a first voltage to a second voltage. In other words, by virtue of implementing varactor (Var) having a particular C/V response with an opposite trend (e.g. opposite slope) to that of the NFET C/V drain-source response, an improved response with a desired flattened portion can be achieved. As an example, the flattened or constant region (210) of the curve may extend over a +/−0.5 V range. It should also be noted that one of the reasons for such improved response is the specific way of coupling the varactor (Var) across the NFET, where one terminal of the varactor (Var) or VVC is connected to a source terminal of the NFET and the other terminal of the varactor (Var) or VVC is connected to a drain terminal of the NFET. Such connection has the advantage of compensating for potential process variations in the manufacturing of the NFET or temperature-based variations in the behavior of the NFET.

Figure 3B:
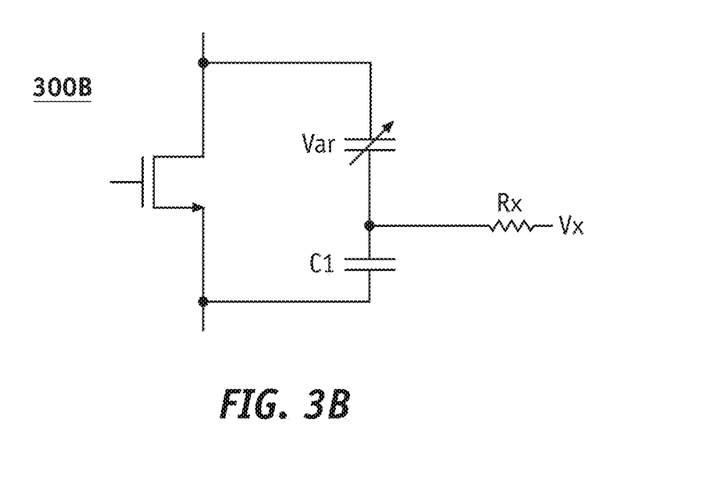

FIG. 3B shows another exemplary circuit arrangement (300B) according to an embodiment of the present disclosure. As shown in this case, differently from the embodiment of FIG. 3A, varactor (Var) is implemented in series with capacitor (C1) which is mainly used for DC blocking, although it can also be used to reduce the effect of the varactor relative to the NFET by adjusting the coupling (i.e. a smaller value of capacitor (C1) would reduce the effect of the varactor). Varactor (Var) is coupled at one end to biasing voltage (Vx) through resistor (Rx). In an embodiment, resistor (Rx) may be replaced by an RF choke. Differently from circuit arrangement (300A) of FIG. 3A, varactor (Var) of FIG. 3B can be biased independently from the NFET device for additional control of NFET non-linear capacitance. The teaching of flattening the C/V response to cancel the non-linear capacitance of the NFET device as disclosed with regards to circuit arrangement (300A) of FIG. 3A, applies also to circuit arrangement (300B) of FIG. 3B.

Figure 3C:
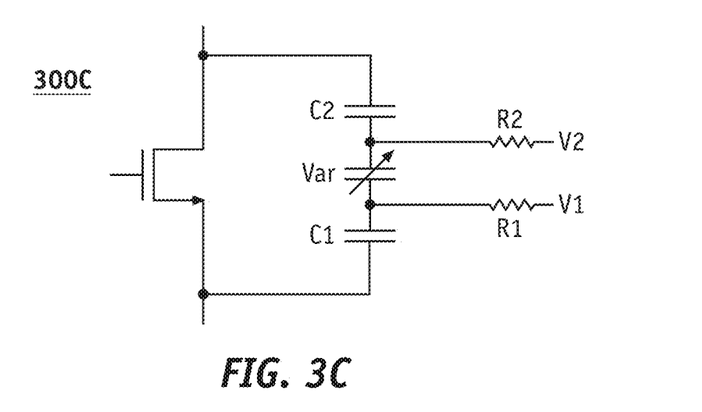

FIG. 3C shows an exemplary circuit arrangement (300C) according to a further embodiment of the present disclosure. As shown in this case, differently from the embodiment of FIG. 3A, varactor (Var) is implemented in series with capacitors (C1, C2) which are mainly used for DC blocking. Varactor (Var) is connected at one end to biasing voltage (V1) via resistor (R1) and at another end to biasing voltage (V2) via resistor (R2). As a result, differently from circuit arrangement (300A) of FIG. 3A, varactor (Var) can be biased independently from the NFET device for additional control of NFET non-linear capacitance. The teaching of flattening the C/V response to cancel the non-linear capacitance of the NFET device as disclosed with regards to circuit arrangement (300A) of FIG. 3A, applies also to circuit arrangement (300C) of FIG. 3C.

Figure 3D:
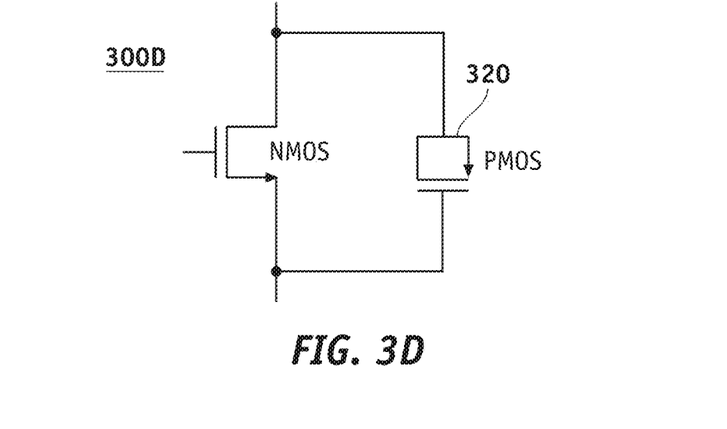

FIG. 3D shows yet another circuit arrangement (300D) in accordance with an embodiment of the present disclosure. As shown, the voltage variable capacitor (VVC) includes a PMOS device capacitor (320) coupled across the NFET device. The teaching of flattening the C/V response to cancel the non-linear capacitance of the NFET device as disclosed with regards to circuit arrangement (300A) of FIG. 3A, applies also to circuit arrangement (300D) of FIG. 3D. However, as PMOS device capacitor (320) has a different C/V slope compared to varactor (Var) of FIG. 3A, the NFET device non-linear capacitance cancelation may be less effective in the case of the embodiment of FIG. 3D. According to the teachings of the present disclosure, the voltage variable capacitor (VVC) may include a PMOS device as described, a well junction, a PN junction, or any device that provides a complementary C/V response.

The circuit arrangements of FIGS. 3A-3D may be used in applications where the NFET device is implemented as a high-power switch to cancel the non-linear capacitance of such high-power switch when in the OFF state. In such applications, the NFET device may be manufactured in bulk-CMOS and RF floating methods as described, for example, with regards to RF switch of FIG. 1C, may be applied. Similarly, the circuit arrangements of FIGS. 3A-3D may be implemented in case of high-power switches manufactured in SOI technology. Additionally, the teachings of the present disclosure can be applied to a PMOS switching device as well by using the appropriate VVC response.

Figure 4A:
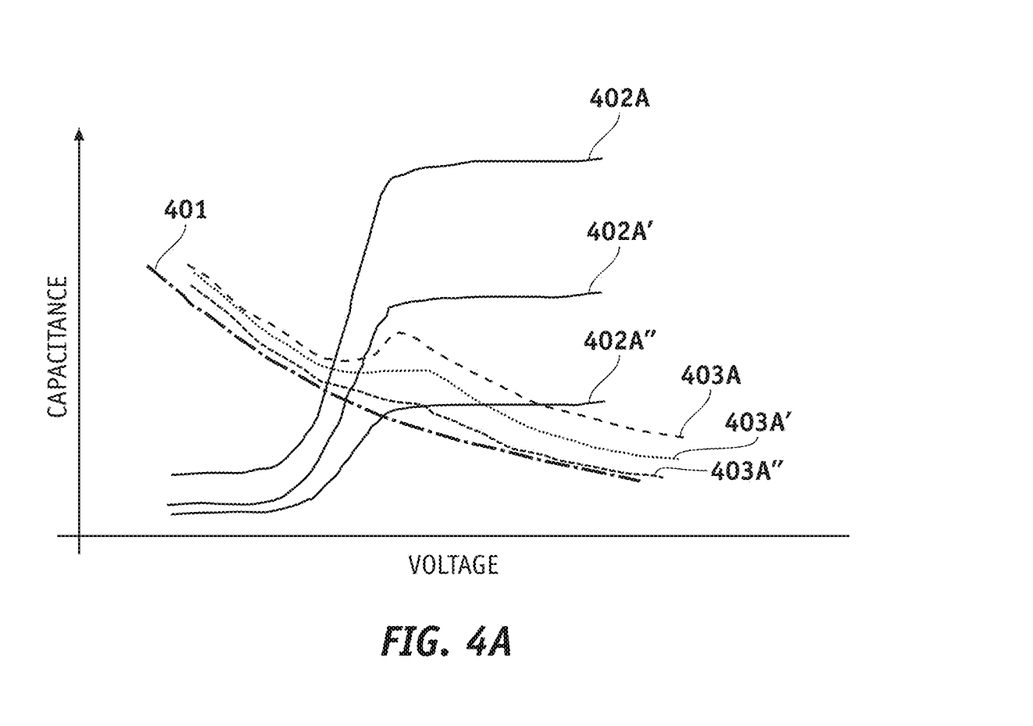
FIGS. 4A-4B show exemplary C/V responses of switching arrangements according to an embodiment of the present disclosure.

With reference to FIG. 2 and, for example, FIG. 3B, according to the teachings of the present disclosure, the magnitude and location of the voltage range ΔV (i.e. values of the first voltage and the second voltage across which the voltage range extends) can be changed by adjusting the size and the biasing of the varactor respectively. As an example, circuit arrangement (300B) of FIG. 3B is considered. FIG. 4A shows a set of curves (402A, 402A', 402A") representing three C/V response curves corresponding to three different varactors (Var) of FIG. 3B each having a different size. Curve (402A) corresponds to the largest varactor and curve (402A") corresponds to the smallest varactor. Combining each of curve of the set of curves (402A, 402A', 402A") with the C/V response of the NFET device of FIG. 3B, shown as curve (401) in FIG. 4A, results in three associated overall C/V responses represented with a set of respective curves (403A, 403A', 403A"). In a typical application the size of the varactor may be, for example, 5% of the size of the NFET device. According to the teachings of the present disclosure, the cancellation response can be tuned to match the NMOS C-V response by adjusting the VVC size, adjusting any coupling capacitor values (to increase or reduce the VVC effect), or a combination of VVC size and coupling capacitor value.

Figure 4B:
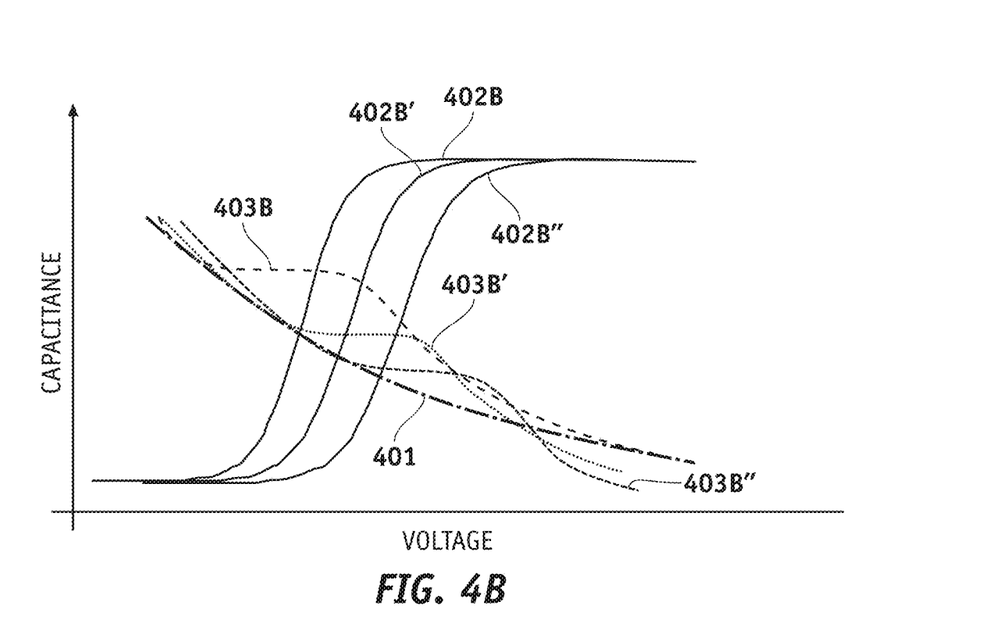
Figure 5A:
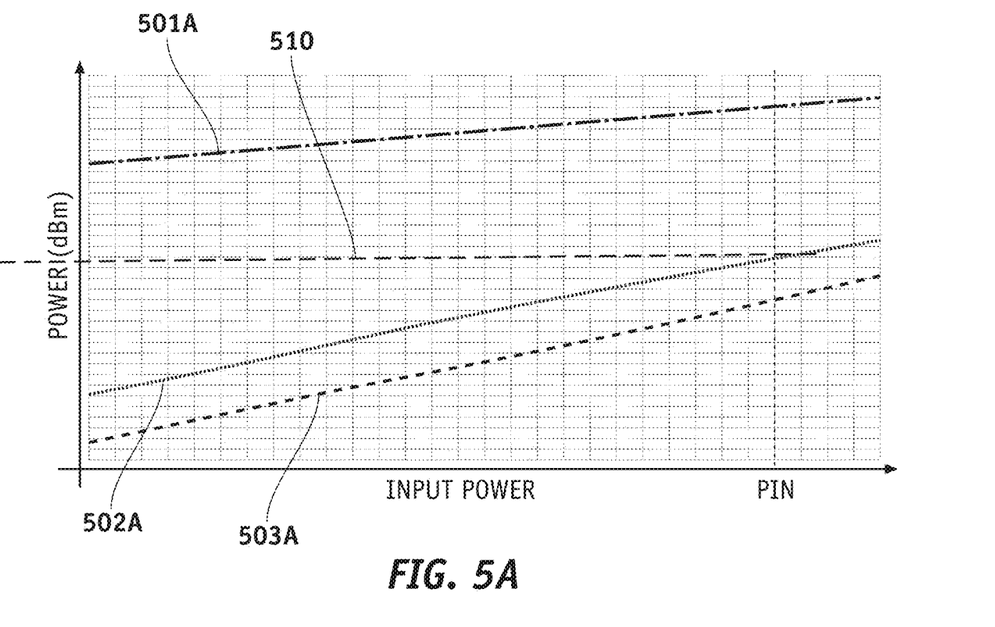
FIGS. 5A-5B show exemplary simulation results according to an embodiment of the present disclosure.

FIG. 4B shows a set of curves (402B, 402B', 402B") representing three C/V response curves corresponding to three different voltages supplied by the bias voltage (Vx) to varactors (Var) of FIG. 3B. Curve (402B) corresponds to the largest bias voltage and curve (420B") corresponds to the smallest bias voltage. Combining the set of curves (402B, 402B', 402B") with the C/V response of the NFET device of FIG. 3B, shown as curve (401) in FIG. 4B, results in three associated C/V responses represented with a set of respective curves (403B, 403B', 403B"). As can be seen in the set of curves (403B, 403B', 403B") of FIG. 4B, the flattened regions can be moved horizontally in correspondence with the voltage supplied bias voltage (Vx) to varactor (Var). With reference to FIGS. 3A-3C, according to the teachings of the present disclosure, varactor (Var) may be replaced by multiple varactors placed in parallel, each of the varactors having their own bias. This provides the benefit of extending the range of cancellation by staggering varactor transition regions FIG. 5A shows simulation results illustrating the variations of the output power, in dBm, vs. the input power, in dBm, of a high-power RF switch without applying the teachings of the present disclosure. Curves (501A, 502A, 503A) represent the first, second and third harmonics respectively. The power level requirement (i.e. specification) for the harmonics is shown with the horizontal dotted line (510). As can be seen, the second harmonics just meets the specification and the third harmonics has some margin, which may still not be sufficient for some applications.

Figure 5B:
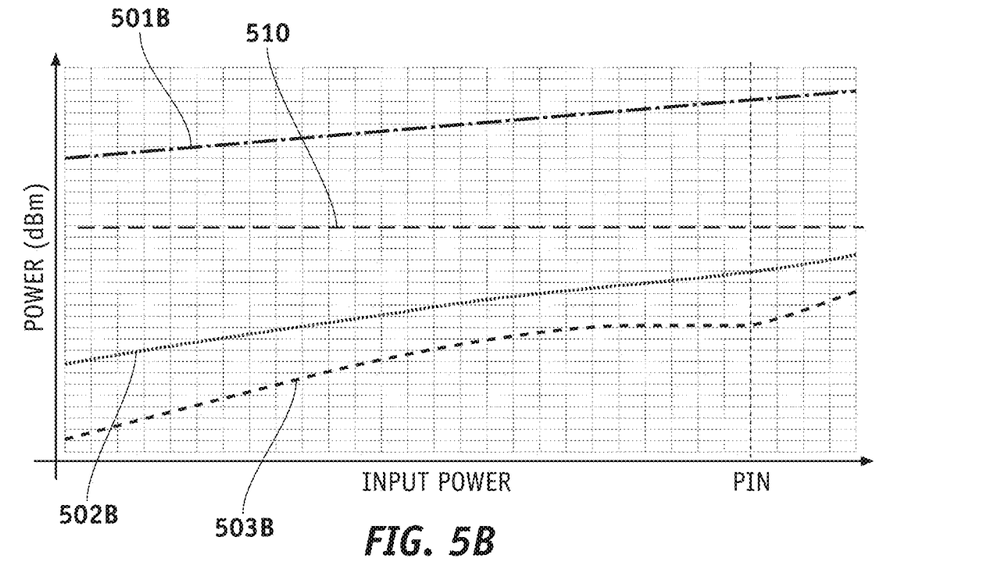

FIG. 5B shows, on the other hand, the simulation results illustrating the variations of the output power in dBm, vs. the input power in dBm, of the same high-power RF switch when the teachings of the present disclosure have been applied (i.e. a varactor has been implemented in parallel to the switch), with curves (501B, 502B, 503B) representing the first, second and third harmonic respectively. In both cases shown in FIGS. 5A-5B, the switch is fabricated in bulk-CMOS while implementing RF floating. As can be seen, the results are improved after implementing the disclosed methods. In other words, now both the second and the third harmonics have margins (e.g. 5, and 10 dB respectively).

Figure 6A:
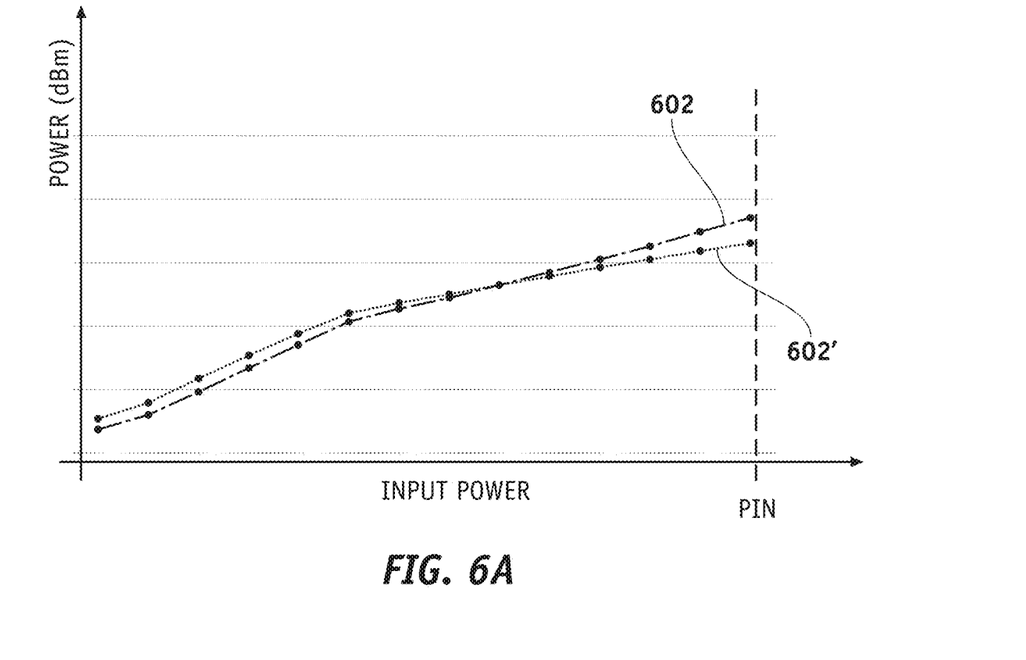
FIGS. 6A-6B show exemplary measurements results according to an embodiment of the present disclosure.
Figure 6B:
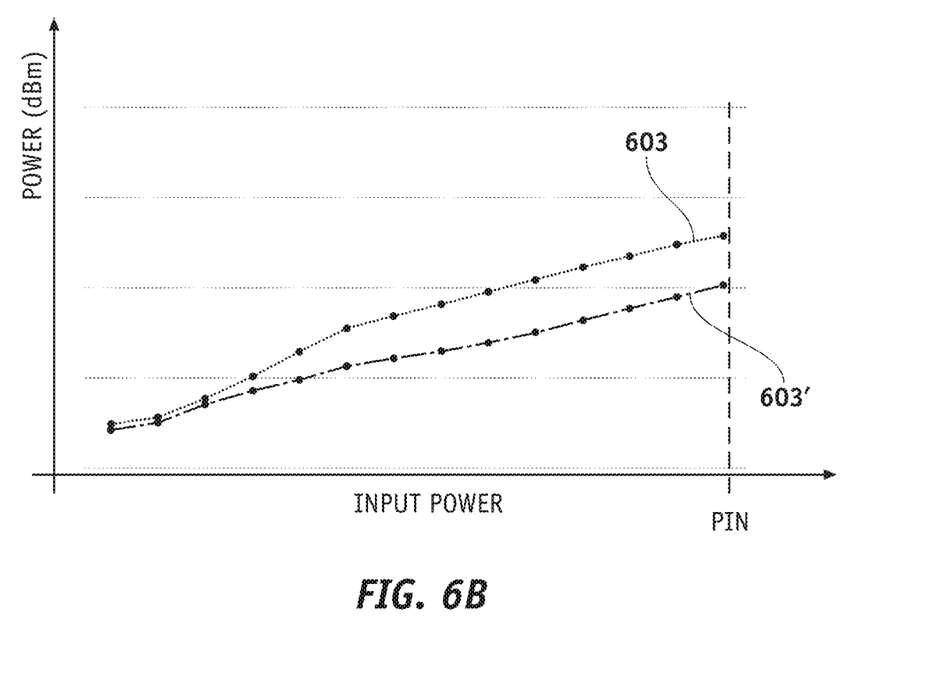

In order to confirm the above-mentioned simulation results, the inventors have performed some measurements of the variations of the output power in dBm, vs. the input power in dBm, of a high-power Bulk CMOS RF switch. FIGS. 6A-6B shows the results of some measurements. Curves (602, 602') of FIG. 6A represent the second harmonics without and with application of the disclosed methods, respectively. As shown in FIG. 6A, for an exemplary input power (Pin) improvement can be noticed (e.g. 4 dB). Moreover, Curves (603, 603') of FIG. 6B represent the third harmonics without and with application of the disclosed methods, respectively. As shown in FIG. 6B, for the exemplary input power (Pin), improvement can be noticed (e.g. 11 dB).

Figure 7A:
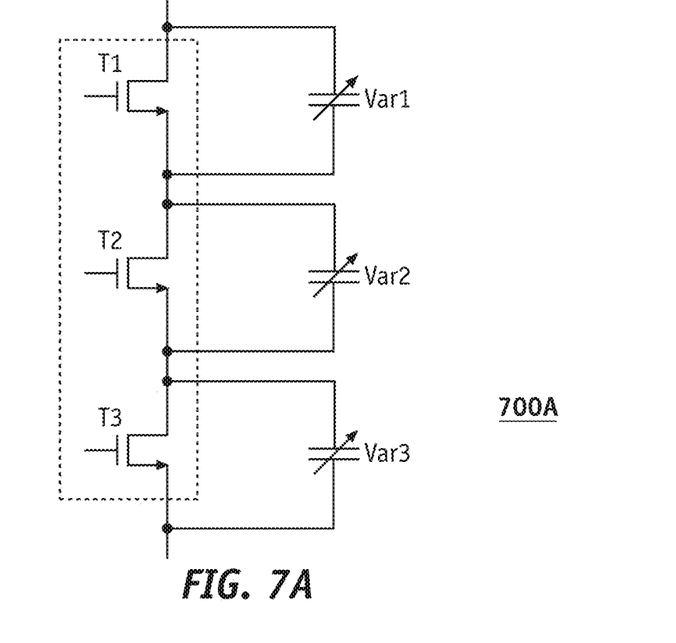
FIGS. 7A-7B show exemplary stacked switching arrangements according to an embodiment of the present disclosure.
Figure 7B:
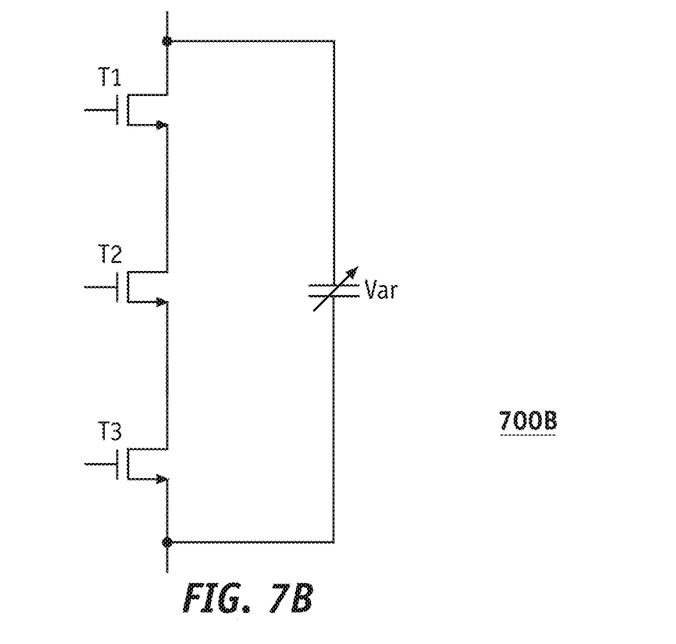

The disclosed methods and concepts are also applicable to stacked RF switches. FIG. 7A shows an exemplary switching arrangement (700A) wherein transistors (T1, T2, T3) are configured in stack and for each of such transistors a varactor is implemented similarly to what was described with regards to embodiment of FIG. 3A. In order words, varactors (Var1, Var2, Var3) are implemented in correspondence with transistors (T1, T2, T3). This is in contrast with the switching arrangement (700B) of FIG. 7B, where one varactor (Var) is implemented across the entire stack. The teachings disclosed with regards to embodiments of FIGS. 3A-3C equally apply to embodiments of FIG. 7A-7B. More in particular, with regards to the embodiment of FIG. 7B, the C/V response of varactor (Var) is used to compensate for the C/V response across the drain terminal of transistor (T1) and the source terminal of transistor (T3). With reference to FIG. 7A, embodiments in accordance with the teachings of the disclosure may be envisaged wherein transistors (T1, . . . , T3) may have the same or different sizes and varactors (Var1, . . . , Var3) may have the same or different sizes.

With further reference to FIGS. 3A-3D, and 7A, the person skilled in the art will appreciate that each transistor shown in such figures has a corresponding one-to-one varactor for C/V response compensation. This will result an improved and more flexible non-linear C/V compensation method.

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale;

some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A method for controlling a capacitance of an N-channel field effect transistor (NFET) when in OFF state over a voltage range, the NFET being implemented in a bulk complementary metal-oxide-semiconductor (CMOS) process, the method comprising:
   RF floating and N-well a body and a substrate of the NFET, and
   coupling a voltage variable capacitor across drain and source terminals of the NFET such that a combination of capacitance-voltage (C/V) responses of the voltage variable capacitor and the NFET drain-source includes a substantially constant capacitance region along a voltage range.

2. The method of claim 1, wherein the RF floating step includes:
   coupling the body of the NFET to a first bias voltage through a first resistor;
   coupling the N-well of the NFET to a second bias voltage through a second resistor, and
   coupling the substrate of the NFET to a reference voltage or ground.

3. The method of claim 2, further comprising:
   operating the NFET in the voltage range.

4. The method of claim 2, wherein
   the voltage range along which the capacitance of the combination C/V response is substantially constant is a function of a size of the voltage variable capacitor.

5. The method of claim 2, wherein the voltage range extends from a first voltage to a second voltage, and wherein coupling the selected voltage variable capacitor across the NFET further comprises
   biasing the variable voltage capacitor with a bias voltage and adjusting the bias voltage based on desired values for the first voltage and the second voltage.

6. The method of claim 5, wherein the coupling of the voltage variable capacitor across drain and source terminals of the NFET further comprises coupling the voltage variable capacitor in series with a first capacitor and a second capacitor, the voltage variable capacitor being between the first capacitor and the second capacitor.

7. The method of claim 6, wherein the biasing the voltage variable capacitor with the bias voltage comprises biasing one of a first end or a second end of the selected voltage variable capacitor with a first biasing voltage (V1) and biasing the other of the first end or second end of the selected voltage variable capacitor with a second biasing voltage (V2), thus biasing the selected voltage variable capacitor independently of the NFET.

8. The method of claim 2, wherein the voltage variable capacitor is a PMOS device capacitor.

9. The method of claim 2, wherein the NFET comprises:
a stacked arrangement of NFETs;
the voltage variable capacitor comprises plural series arrangements of voltage variable capacitors and additional capacitors, and
each series arrangement is coupled across drain and source of a corresponding NFET of the stacked arrangement by connecting a first terminal of said each series arrangement to a drain terminal of the corresponding NFET and a second terminal of said each series arrangement to a source terminal of the corresponding NFET.

10. The method of claim 2, wherein the NFET comprises a stacked arrangement of NFETs and wherein the voltage variable capacitor is coupled across a drain of a topmost NFET of the stacked arrangement and a source of a bottommost NFET of the stacked arrangement by connecting a first terminal of the voltage variable capacitor to a drain terminal of the topmost NFET and a second terminal of the voltage variable capacitor to a source terminal of the bottommost NFET.

11. The bulk-CMOS process for manufacturing the N-channel field effect transistor (NFET), the process comprising:
manufacturing the NFET and
controlling linearity of the NFET according to the method of claim 2.

12. A switching arrangement fabricated in a bulk complementary metal-oxide-semiconductor (CMOS) process, the switching arrangement comprising:
a switching N-channel field effect transistor (NFET), the switching NFET having a nonlinear NFET drain-source capacitance-voltage (C/V) response; and
a series arrangement of a voltage variable capacitor and a first capacitor with a first terminal coupled to a drain terminal of the switching NFET and a second terminal connected to a source terminal of the switching NFET, the voltage variable capacitor having a voltage variable capacitor C/V response,
wherein
a combination C/V response of the switching NFET and the voltage variable capacitor includes a substantially constant capacitance region across a selected voltage range;
a body of the switching NFET is configured to be radio frequency (RF) floated, and
an N-well of the switching NFET is configured to RF floated.

13. The switching arrangement of claim 12, wherein a substrate of the switching NFET is configured to be coupled to a reference voltage or ground.

14. The switching arrangement of claim 13, wherein the body of the switching NFET is configured to be coupled to a first bias voltage through a first resistor.

15. The switching arrangement of claim 14, wherein the N-well of the switching NFET is configured to be coupled to a second bias voltage through a second resistor.

16. The switching arrangement of claim 15, further comprising a voltage variable capacitor biasing arrangement to adjust a location of the selected voltage range according to a biasing voltage of the voltage variable capacitor biasing arrangement.

17. The switching arrangement of claim 16, wherein the voltage variable capacitor is coupled to a first bias voltage through a first bias resistor.

18. The switching arrangement of claim 17 wherein one of the first terminal or the second terminal is coupled
to the drain terminal of the NFET through a second capacitor, the voltage variable capacitor being disposed between the first capacitor and the second capacitor, and
to a second bias voltage through a second bias resistor, the first bias voltage and the second bias voltage being coupled to separate ends of the voltage variable capacitor.

* * * * *